(12) United States Patent
Wu et al.

(10) Patent No.: US 9,201,729 B2
(45) Date of Patent: Dec. 1, 2015

(54) SYSTEMS AND METHODS FOR SOFT DATA UTILIZATION IN A SOLID STATE MEMORY SYSTEM

(71) Applicant: SEAGATE TECHNOLOGY LLC, Cupertino, CA (US)

(72) Inventors: Yunxiang Wu, Cupertino, CA (US); Yu Cai, San Jose, CA (US); Erich F. Haratsch, San Jose, CA (US)

(73) Assignee: SEAGATE TECHNOLOGY, LLC, Cupertino, CA (US)

( * ) Notice: Subject to any disclaimer, the term of this patent is extended or adjusted under 35 U.S.C. 154(b) by 207 days.

(21) Appl. No.: 14/072,574

(22) Filed: Nov. 5, 2013

(65) Prior Publication Data

US 2015/0113318 A1  Apr. 23, 2015

Related U.S. Application Data

(60) Provisional application No. 61/893,335, filed on Oct. 21, 2013.

(51) Int. Cl.
*H03M 13/00* (2006.01)
*G06F 11/10* (2006.01)

(52) U.S. Cl.
CPC .................. *G06F 11/1068* (2013.01)

(58) Field of Classification Search
CPC ........... G06F 11/1068; G06F 11/1008; H03M 13/1111
USPC ........................................................ 714/780
See application file for complete search history.

(56) References Cited

U.S. PATENT DOCUMENTS

| | | | |
|---|---|---|---|
| 5,892,896 A | 4/1999 | Shingo | |
| 6,516,425 B1 | 2/2003 | Belhadj et al. | |
| 6,651,032 B2 | 11/2003 | Peterson et al. | |
| 7,127,549 B2 | 10/2006 | Sinclair | |
| 7,254,692 B1 | 8/2007 | Teoh et al. | |
| 7,310,699 B2 | 12/2007 | Sinclair | |
| 7,523,013 B2 | 4/2009 | Gorobets et al. | |
| 7,596,656 B2 | 9/2009 | Elhamias | |
| 7,721,146 B2 | 5/2010 | Polisetti et al. | |
| 7,778,077 B2 | 8/2010 | Gorobets et al. | |
| 7,966,550 B2 * | 6/2011 | Mokhlesi et al. | 714/780 |
| 8,010,738 B1 | 8/2011 | Chilton et al. | |
| 8,151,137 B2 | 4/2012 | McKean et al. | |
| 8,174,912 B2 | 5/2012 | Warren | |
| 8,176,367 B2 | 5/2012 | Dreifus | |
| 8,289,768 B2 | 10/2012 | Warren et al. | |
| 8,381,077 B2 | 2/2013 | Warren | |
| 8,458,416 B2 | 6/2013 | Warren et al. | |
| 8,499,220 B2 | 7/2013 | Warren | |
| 8,560,765 B2 | 10/2013 | Warren | |

(Continued)

FOREIGN PATENT DOCUMENTS

KR   10/2009-0013394   2/2009

OTHER PUBLICATIONS

U.S. Appl. No. 14/072,530, filed Nov. 5, 2013, Cai.

(Continued)

*Primary Examiner* — David Ton
(74) *Attorney, Agent, or Firm* — Holland & Hart

(57) ABSTRACT

Systems and methods relating generally to solid state memory, and more particularly to systems and methods for recovering data from a solid state memory.

20 Claims, 6 Drawing Sheets

(56) References Cited

U.S. PATENT DOCUMENTS

| | | |
|---|---|---|
| 2002/0091965 A1 | 7/2002 | Moshayedi |
| 2005/0044459 A1 | 2/2005 | Scheuerlein et al. |
| 2005/0172067 A1 | 8/2005 | Sinclair |
| 2005/0204187 A1 | 9/2005 | Lee et al. |
| 2005/0209804 A1 | 9/2005 | Basso et al. |
| 2006/0245248 A1 | 11/2006 | Hu |
| 2007/0028040 A1 | 2/2007 | Sinclair |
| 2007/0266200 A1 | 11/2007 | Gorobets et al. |
| 2008/0010557 A1 | 1/2008 | Kume |
| 2008/0046779 A1 | 2/2008 | Merchant et al. |
| 2008/0086275 A1 | 4/2008 | Astigarraga et al. |
| 2008/0162079 A1 | 7/2008 | Astigarraga et al. |
| 2008/0307270 A1 | 12/2008 | Li |
| 2009/0063895 A1 | 3/2009 | Smith |
| 2009/0067303 A1 | 3/2009 | Poo et al. |
| 2009/0147698 A1 | 6/2009 | Potvin |
| 2009/0172280 A1 | 7/2009 | Trika et al. |
| 2009/0204853 A1 | 8/2009 | Diggs et al. |
| 2009/0282301 A1 | 11/2009 | Flynn et al. |
| 2010/0121609 A1 | 5/2010 | Gorinevsky |
| 2010/0122148 A1 | 5/2010 | Flynn et al. |
| 2010/0306577 A1 | 12/2010 | Dreifus et al. |
| 2010/0306580 A1 | 12/2010 | McKean et al. |
| 2011/0058415 A1 | 3/2011 | Warren |
| 2011/0060862 A1 | 3/2011 | Warren |
| 2011/0060865 A1 | 3/2011 | Warren et al. |
| 2011/0225350 A1* | 9/2011 | Burger et al. ............... 711/103 |
| 2012/0079355 A1* | 3/2012 | Patapoutian et al. ......... 714/780 |
| 2012/0102261 A1 | 4/2012 | Burger et al. |
| 2012/0110376 A1 | 5/2012 | Dreifus et al. |
| 2012/0198314 A1* | 8/2012 | Yang et al. .................... 714/782 |

OTHER PUBLICATIONS

U.S. Appl. No. 14/072,571, filed Nov. 5, 2013, Wu.

U.S. Appl. No. 14/047,423, filed Oct. 7, 2013, Haitao Xia, Unpublished.

U.S. Appl. No. 13/912,063, filed Jun. 6, 2013, Fan Zhang, Unpublished.

* cited by examiner

SYSTEMS AND METHODS FOR SOFT DATA UTILIZATION IN A SOLID STATE MEMORY SYSTEM

CROSS REFERENCE TO RELATED APPLICATIONS

The present application claims priority to (is a non-provisional of) U.S. Pat. App. No. 61/893,335 entitled "Systems and Methods for Soft Data Utilization in a Solid State Memory System", and filed Oct. 21, 2013 by Wu et al. The entirety of the aforementioned provisional patent application is incorporated herein by reference for all purposes.

FIELD OF THE INVENTION

Systems and method relating generally to solid state memory, and more particularly to systems and methods for recovering data from a solid state memory.

BACKGROUND

Data in a solid state storage device decays over time requiring more error correction capability over time. To correct additional errors, enhanced error correction circuitry may be employed. Such error correction circuitry may rely on probability information related to data accessed from the storage device which is not readily available in an accurate format.

Hence, for at least the aforementioned reasons, there exists a need in the art for advanced systems and methods for recovering data from a solid state storage device.

SUMMARY

Systems and method relating generally to solid state memory, and more particularly to systems and methods for recovering data from a solid state memory.

Various embodiments of the present invention provide data processing systems that include a soft data modification circuit and a data decoder circuit. The soft data modification circuit is operable to apply a transfer function to an original soft data corresponding to the data set accessed from a memory device to yield a modified soft data set. The data decoder circuit operable to apply one or more iterations of a data decoding algorithm to the data set accessed from the memory device to yield a decoded output based at least in part on the modified soft data.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
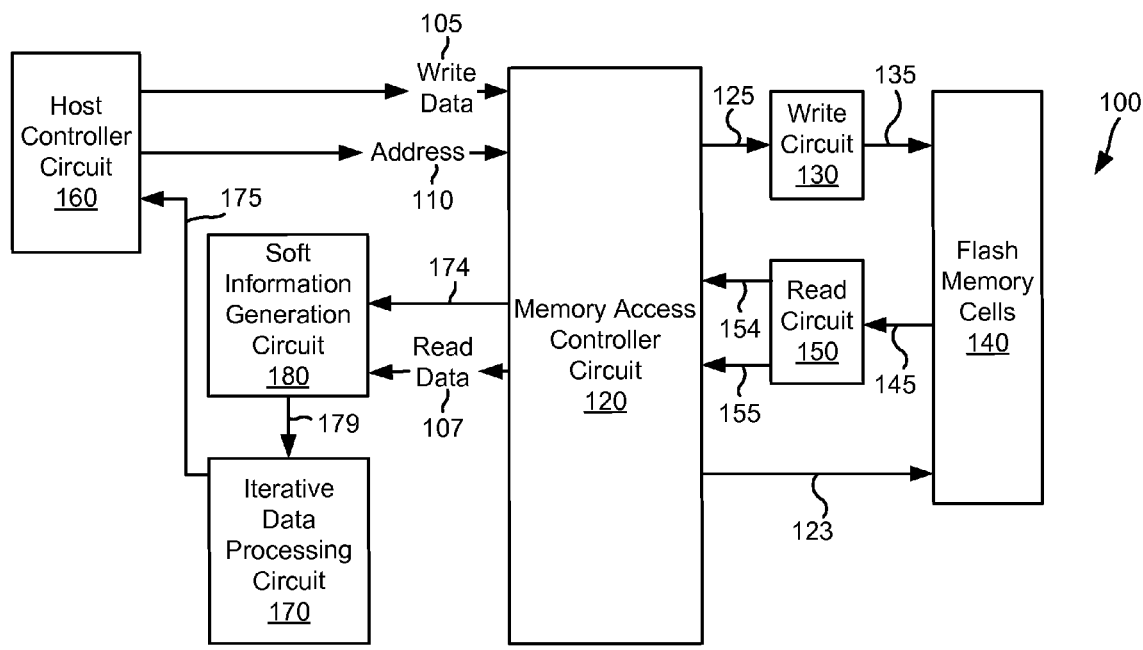
FIG. 1 shows a solid state storage device including a soft information generation circuit in accordance with various embodiments of the present invention.

Systems and method relating generally to solid state memory, and more particularly to systems and methods for recovering data from a solid state memory.

Various embodiments of the present invention provide solid state memory systems that include an iterative data processing circuit. Where data accessed from a solid state memory includes one or more errors, the iterative data processing circuit applies one or more iterations of a data decoding algorithm in an attempt to correct any errors. To facilitate application of the data decoding algorithm, soft information corresponding to the data accessed from the solid state memory is either received from the solid state memory or it is generated based on use of the solid state memory. This soft information is then converted using a transfer function to achieve increased utility when used in relation to applying the data decoding algorithm.

Various embodiments of the present invention provide data processing systems that include a soft data modification circuit and a data decoder circuit. The soft data modification circuit is operable to apply a transfer function to an original soft data corresponding to the data set accessed from a memory device to yield a modified soft data set. The data decoder circuit operable to apply one or more iterations of a data decoding algorithm to the data set accessed from the memory device to yield a decoded output based at least in part on the modified soft data. In some instances of the aforementioned embodiments, the data decoding algorithm is a low density parity check decoding algorithm.

In various instances of the aforementioned embodiments, the transfer function is a non-uniform transfer function. In some cases, the non-uniform transfer function is operable to decrease a probability indicated by a first portion of the original soft data, and to increase a probability indicating by a second portion of the original soft data. In one particular case, the first portion of the original soft data exhibits a lower probability than the second portion of the original soft data. In other instances of the aforementioned embodiments, the original soft data includes a first number of bits per element and the modified soft data set includes a second number of bits per element. In such instances, the transfer function may be a non-uniform transfer function that is applied to yield an interim data set, and the soft data modification circuit is further operable to force the value of any element of the interim data set that falls outside of a range of the second number of bits per element to equal the nearest extreme of the range to yield the modified soft data set.

In one or more instances of the aforementioned embodiments, the data processing system is implemented in an integrated circuit. In various instances of the aforementioned embodiments, the data processing system further includes a memory device operable to maintain the data set. In such instances, the data processing system including the memory device is implemented on an integrated circuit. In some cases, the memory device is a flash memory device. In particular cases, the flash memory device is able to hold multiple bits of data in each memory cell of the flash memory device. In some cases, the system further includes a soft data generation circuit operable to generate the original soft data.

Other embodiments of the present invention provide methods for recovering data from a memory. The method includes: receiving a data set from a solid state memory device memory device; applying a transfer function to an original soft data corresponding to the data set accessed from a memory device to yield a modified soft data set; and applying at least one iteration of a data decoding algorithm to the modified soft data set using a data decoding circuit to yield a decoded output. In some instances of the aforementioned embodiments, the data decoding algorithm is a low density parity check decoding algorithm.

In some instances of the aforementioned embodiments of the present invention, the transfer function is a non-uniform transfer function. In some cases, the non-uniform transfer function is operable to decrease a probability indicated by a first portion of the original soft data, and to increase a probability indicating by a second portion of the original soft data. In one particular cases, the first portion of the original soft data exhibits a lower probability than the second portion of the original soft data.

In various instances of the aforementioned embodiments, the original soft data includes a first number of bits per element, and the modified soft data set includes a second number of bits per element. In such instances, the transfer function may be a non-uniform transfer function that is applied to yield an interim data set, and the soft data modification circuit is further operable to force the value of any element of the interim data set that falls outside of a range of the second number of bits per element to equal the nearest extreme of the range to yield the modified soft data set.

Turning to FIG. 1, a solid state storage device 100 including a soft information generation circuit 170 is shown in accordance with various embodiments of the present invention. Storage device 100 includes a host controller circuit 160 that directs read and write access to flash memory cells 140. Flash memory cells 140 may be NAND flash memory cells or another type of solid state memory cells as are known in the art.

A data write is effectuated when host controller circuit 160 provides write data 105 to be written along with an address 110 indicating the location to be written. A memory access controller 120 formats write data 105 and provides an address 123 and an encoded write data 125 to a write circuit 130. Write circuit 130 provides a write voltage 135 corresponding to respective groupings of encoded write data 125 that is used to charge respective flash memory cells addressed by address 123. It should be noted that in some cases that part of write circuit 130 is implemented as part of a flash memory chip and another part of write circuit 130 is implemented as part of another chip. In such cases, the portion of write circuit 130 outside of the flash memory chip passes encoded write data 125 along with a write command to the portion of write circuit 130 that is implemented as part of the flash memory chip. For example, where flash memory cells are two bit cells (i.e., depending upon the read voltage, a value of '11', '10', '00', or '01' is returned), the following voltages may be applied to program the data:

| Two Bit Data Input | Voltage Output |
|---|---|
| '11' | V 3 |
| '10' | V 2 |
| '00' | V 1 |
| '01' | V 0 |

Where V3 is greater than V2, V2 is greater than V1, and V1 is greater than V0. It should be noted that the aforementioned table is merely an example, and that different devices may assign different bit values to the different voltage thresholds. For example in other cases the values in the following table may be used:

| Two Bit Data Input | Voltage Output |
|---|---|
| '01' | V 3 |
| '00' | V 2 |
| '10' | V 1 |
| '11' | V 0 |

Of course, other bit patterns may be assigned to different thresholds.

A data read is effectuated when host controller circuit 160 provides address 110 along with a request to read data from the corresponding location in flash memory chips 140. Memory access controller 120 accesses a read voltage 145 from locations indicated by address 123 and compares the voltage to a number of threshold values to reduce the voltage to a multi-bit read data 155. Using the same two bit example, the following multi-bit read data 155 results:

| Voltage Input | Two Bit Data Output |
|---|---|
| >V 2 | '11' |
| >V 1 | '10' |
| >V 0 | '00' |
| <=V 0 | '01' |

This multi-bit read data 155 is provided from memory access controller 120 to iterative data processing circuit 170 as read data 107. Iterative data processing circuit 170 determines whether there are any errors in read data 107. Where there are no errors in read data 107, iterative data processing circuit 170 provides read data 107 as read data 175, and provides a zero value as an iterative count 179.

Where errors remain, iterative data processing circuit 170 generates or accesses soft data corresponding to read data 107. Such soft data indicates a probability that given elements of read data 107 are correct. In some cases, this soft data is provided by read circuit 150 as soft data 154 and indicates a difference between read voltage 145 and a threshold value for the elements of read data 155. This soft information is provided to a soft information generation circuit 180 as soft data 174. In other embodiments of the present invention, the soft data is not available from read circuit 150. In such embodiments, the soft data may be generated by repeatedly re-reading flash memory cells 140 using varying read reference voltages to yield corresponding read data 107, and then using the results of the multiple instances of read data 107 to generate soft data corresponding to the particular cells. As one example of such an approach, generation of soft data may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application is incorporated herein by reference for all purposes. Such generation of soft data may be done using any approach known in the art for generating soft data.

Soft data 174 may be, for example, log likelihood ratio (LLR) data. Soft data 174 may not be compatible with iterative data processing circuit 170. In such cases, soft information generation circuit 180 modifies soft data 174 to yield a modified soft data 179 that is compatible with iterative data processing system 170. For example, soft data 174 may be five bit data, and modified soft data 179 is four bit data. To perform the modification of soft data 174 to yield modified soft data 179, soft data 174 is quantized to the desired resolution.

Figure 3:
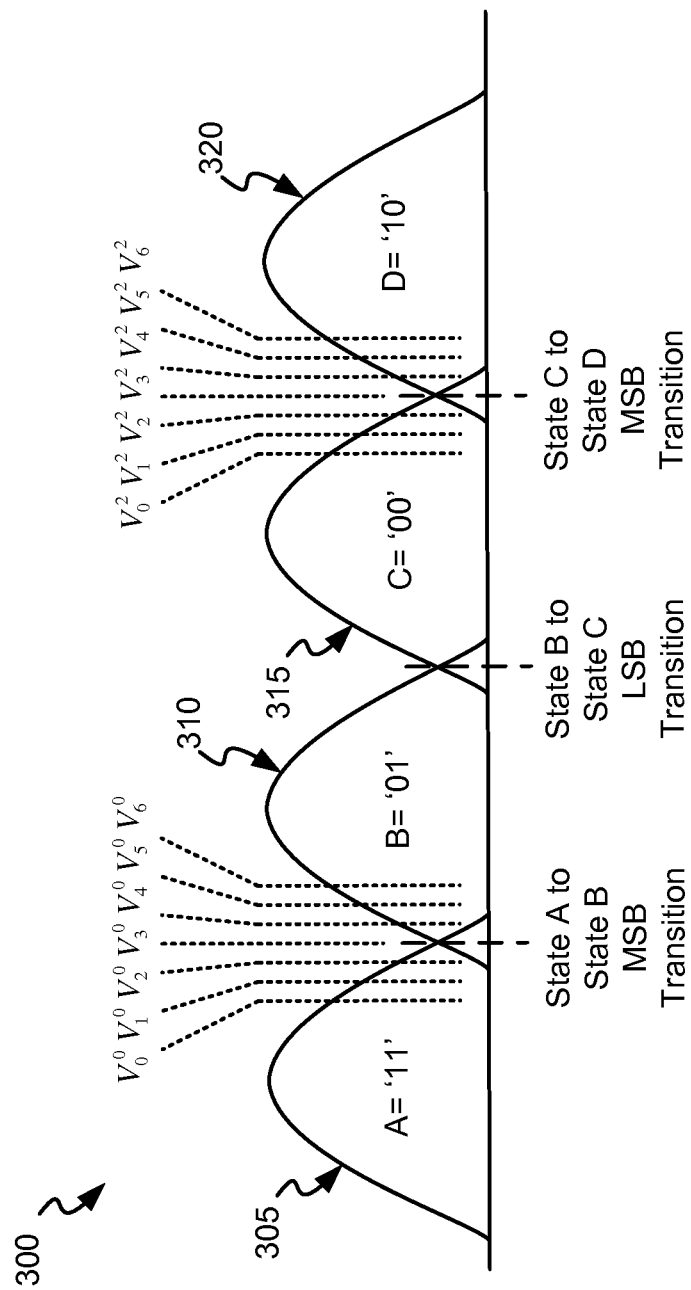
FIG. 3 graphically depicts a voltage distribution in a multi-bit solid state memory device including a number of regions corresponding to different soft information distributions.
Figure 4:
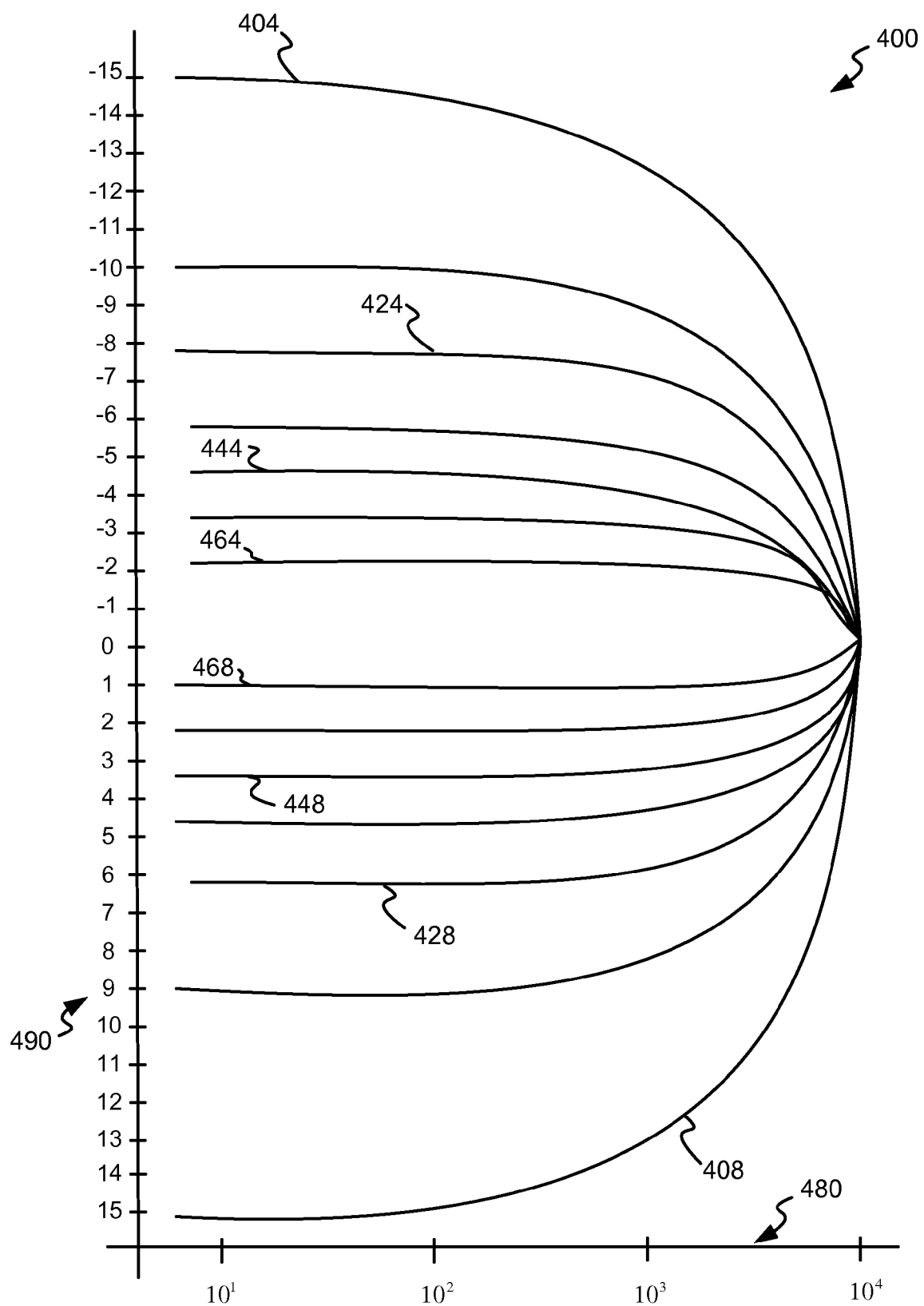
FIG. 4 shows an example of an unmodified distribution of five bit soft information corresponding to the regions of FIG. 3.

Background of such quantization is set forth in FIGS. 3-4. Referring to FIG. 3, a voltage distribution 300 in a multi-bit solid state memory device is graphically depicted. As shown, voltage distribution 300 includes four states 305, 310, 315, 320 (A, B, C, D). Such a four state device is designed to hold four different voltages corresponding to four different two-bit symbols (i.e., A='11', B='01', C='00' and D='10'). It should be noted that while the example is directed at two bit memory cells, other numbers of bits per memory cell may be used in relation to different embodiments of the present invention. For example, single bit memory cells or memory cells holding three or more bits may be used in relation to different embodiments of the present invention.

The most significant bit is changed between state A and state B, and between state C and state D. A number of example voltages are defined between state A and state B ($V_0^0, V_1^0, V_2^0, V_3^0, V_4^0, V_5^0, V_6^0$), and a number of example voltages are defined between state A and state B ($V_0^2, V_1^2, V_2^2, V_3^2, V_4^2, V_5^2, V_6^2$). Fifteen regions exhibiting different soft data are defined in relation to the above mentioned example voltages. A first region is defined to the left of $V_0^0$, a second region is defined between $V_0^0$ and $V_1^0$, a third region is defined between $V_1^0$ and $V_2^0$, a fourth region is defined between $V_2^0$ and $V_3^0$, a fifth region is defined between $V_3^0$ and $V_4^0$, a sixth region is defined between $V_4^0$ and $V_5^0$, a seventh region is defined between $V_5^0$ and $V_6^0$, an eighth region is defined between $V_6^0$ and $V_0^2$, a ninth region is defined between $V_0^2$ and $V_1^2$, a tenth region is defined between $V_1^2$ and $V_2^2$, an eleventh region is defined between $V_2^2$ and $V_3^2$, a twelfth region is defined between $V_3^2$ and $V_4^2$, a thirteenth region is defined between $V_4^2$ and $V_5^2$, a fourteenth region is defined between $V_5^2$ and $V_6^2$, and a fifteenth region is defined to the right of $V_6^6$.

Turning to FIG. 4, a plot 400 shows an example of an unmodified distribution of five bit soft information 490 as a function of a number of reads 480. Each of the curves on plot 400 corresponds to one of the aforementioned regions of FIG. 3. In particular, a curve 464 corresponds to the fourth region and the twelfth region, a curve 468 corresponds to the fifth region and the thirteenth region. A curve 444 corresponds to the third region and the eleventh region, and a curve 448 corresponds to the sixth region and the fourteenth region. A curve 424 corresponds to the second region and the tenth region, and a curve 428 corresponds to the seventh region and the fifteenth region. A curve 404 corresponds to a first region and a ninth region, and a curve 408 corresponds to the eighth region and the sixteenth region.

As shown in FIG. 4, the closer a voltage is to a threshold voltage between states the closer the value of soft data 174 is to zero (i.e., the less likely the data is to have been correctly decoded), and the farther a voltage is from the threshold voltage between states the closer the value of soft data 174 is to a maximum (in this case a +15 or a −15). Further, the more times the solid state memory device is read, the values of soft data 174 reduce until the device is finally not usable.

Figure 5:
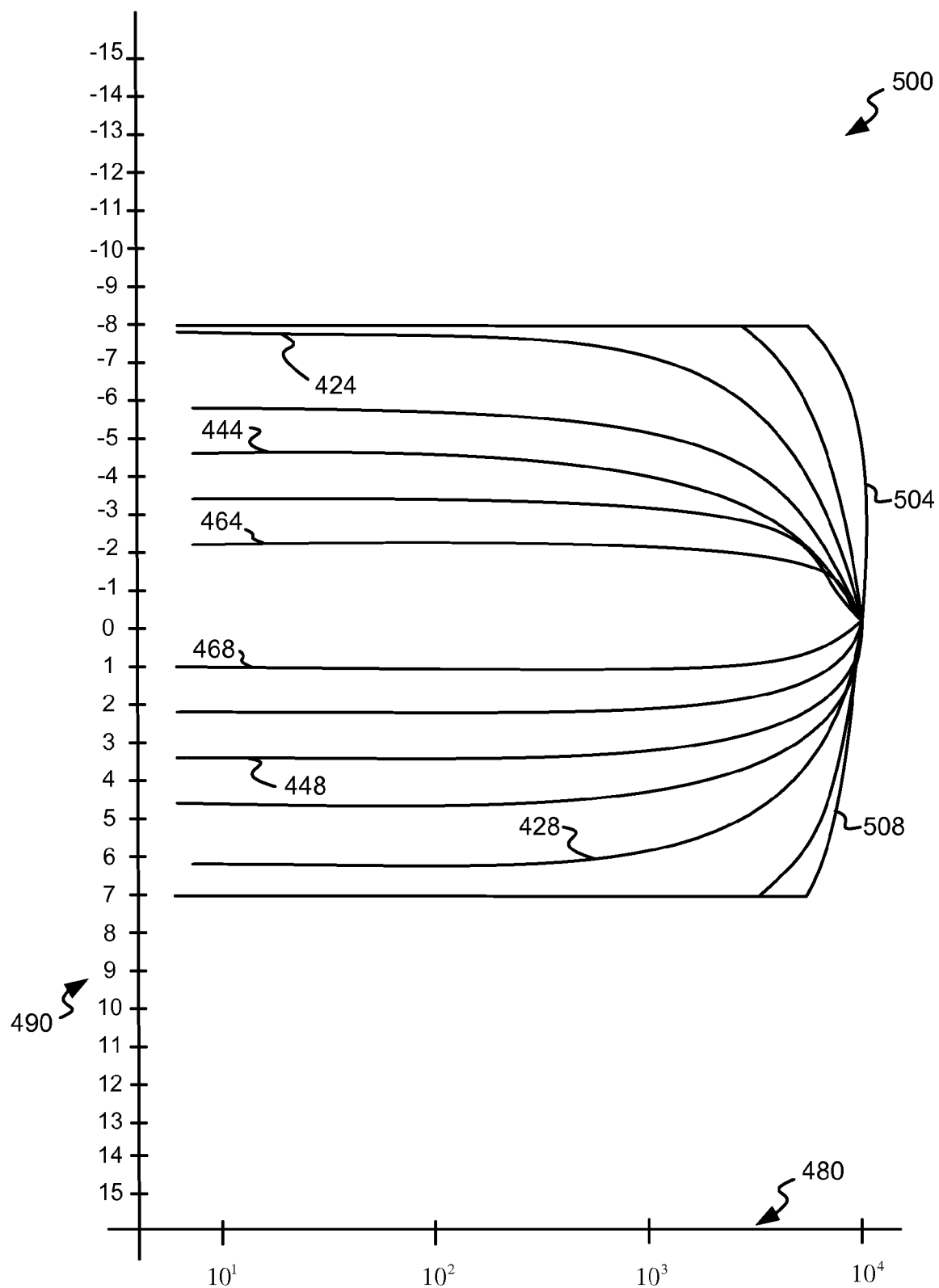
FIG. 5 shows an example of the five bit soft information of FIG. 4 saturated to yield four bit soft information compatible with the input of an iterative decoder.

Referring again to FIG. 1, where iterative data processing circuit 170 requires a four bit input (i.e., extending between −8 and +7), soft data 174 is modified. Turning to FIG. 5, an example 500 of a simple approach for modifying soft data 174 through saturation is shown. As shown, a curve 504 corresponding to curve 404 of FIG. 4 is saturated as a maximum (−8) and a curve 508 corresponding to curve 408 of FIG. 4 is saturated as a maximum (+7). Such an approach is problematic as the elements of soft data 174 indicating the most likely data is saturated making it appear only as reliable as substantially less reliable data. In particular, the soft data associated with curve 504, which is substantially higher than the soft data associated with curve 424, effectively becomes the same as that of curve 424. In such a situation, the resulting modified soft data is less valuable in guiding the application of the data decoding algorithm. This problem is further exaggerated by the fact that most of soft data 174 will exhibit values along curve 504 and curve 508.

Figure 6:
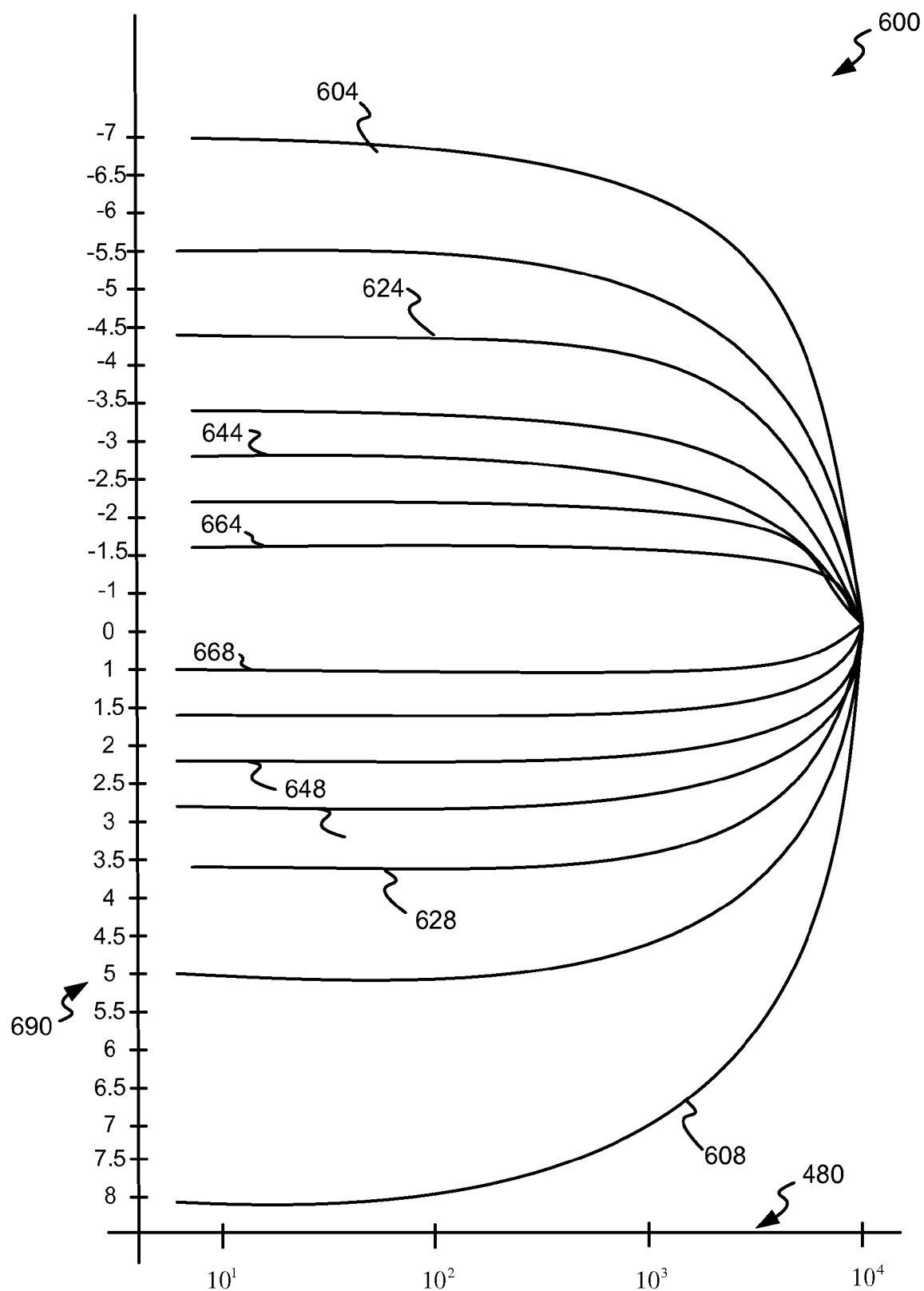
FIG. 6 shows an example of the five bit soft information of FIG. 4 modified by a uniform transfer function to yield four bit soft information compatible with the input of an iterative decoder in accordance with one or more embodiments of the present invention.

Turning to FIG. 6, a uniform transfer function is applied to all elements of soft data 174. In this case, where the modification is to reduce soft data 174 from a five bit data set to a four bit data set, the uniform transfer function is a divide by two function. Such a uniform transfer function results in a simple scaling from a range of −15 to +15 to a range of −7 to +8. As shown, a curve 604 corresponds to a scaled curve 404, a curve 624 corresponds to a scaled curve 424, a curve 644 corresponds to a scaled curve 444, a curve 664 corresponds to a scaled curve 464, a curve 668 corresponds to a scaled curve 668, a curve 648 corresponds to a scaled curve 448, and a curve 628 corresponds to a scaled curve 428, a curve 608 corresponds to a scaled curve 408. Such an approach, while better than the saturation approach of FIG. 5, is still problematic. In this case, elements of soft data 174 indicating the highest likelihood of being correct (i.e., elements along curve 604 and curve 608) are compressed into the next most likely data making it less valuable in guiding the data decoding algorithm.

To alleviate some of the concerns with the approaches discussed in relation to FIG. 5 and FIG. 6, a non-uniform transfer function may be applied to all elements of soft data 174. As an example, each element of soft data 174 may be processed by the following non-uniform transfer function:

$$\text{Interim Value}_i = \text{sign}(\text{soft data}_i) * \text{scalar} * \text{abs}(\text{soft data}_i)^n,$$

where soft data$_i$ is the i$^{th}$ element of soft data 174, n is a power value, and scalar is a scaling value. In a particular example where soft data 174 is five bit data and modified soft data 179 is four bit data, the value of the scalar may be 0.15, and the value of n may be (1.4). Each of Interim Value$_i$ are then rounded to the nearest integer value to yield a Rounded Value$_i$. Any instance of the Rounded Value$_i$ that is outside of the allowed range (e.g., −8 to +7) is saturated at the closest maximum.

Referring again to FIG. 1, iterative data processing circuit 170 repeatedly applies a data decoding algorithm to modified soft data 179 to yield a decoded output. As each iteration of the data decoding algorithm is applied, an iteration count is incremented. Where the decoded output converges (i.e., results in a correction of all remaining errors in read data 107), the decoded output is provided as read data 175. Where the decoded output fails to converge (i.e., errors remain in the decoded output), another iteration of the data decoding algorithm is applied to modified soft data 179 to yield an updated decoded output. This process continues until either all errors are corrected or a timeout condition occurs (e.g., 100 iterations). In some embodiments of the present invention, the data decoding algorithm is a low density parity check algorithm as is known in the art. Based upon the disclosure provided herein, one of ordinary skill in the art will recognize a variety of data decoding algorithms that may be used in relation to various embodiments of the present invention.

Figure 2:
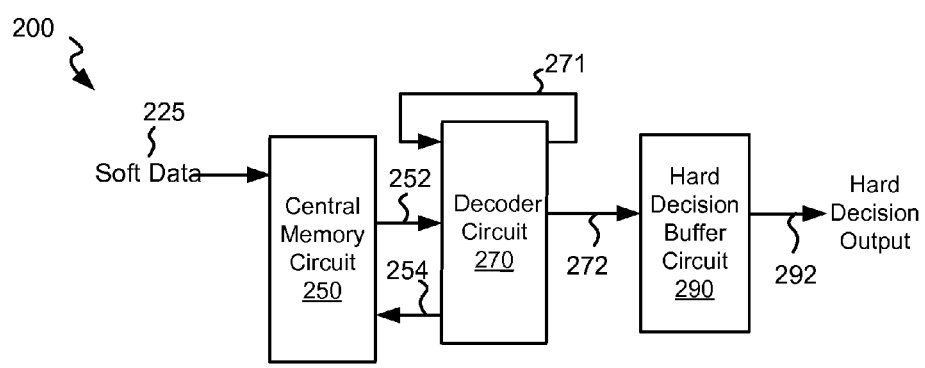
FIG. 2 depicts one implementation of an iterative data processing circuit that may be used in relation to embodiments of the present invention.

Turning to FIG. 2, one implementation of an iterative data processing circuit 200 is shown that may be used in relation to embodiments of the present invention. Where iterative data processing circuit 200 is used in place of iterative data processing circuit 170 of FIG. 1, modified soft data 179 is connected to a soft data input 225, and read data 175 is connected to a hard decision output 292.

Iterative data processing circuit 200 receives soft data 225 and stores it to a central memory circuit 250. Once a decoder circuit 270 is available, a previously stored data set 225 is accessed from central memory circuit 250 as a decoder input 252. In some embodiments of the present invention, the decoder circuit 270 is a low density parity check decoder circuit as is known in the art. Based upon the disclosure provided herein, one of ordinary skill in the art will recognize a variety of decoder circuits that may be used in relation to various embodiments of the present invention.

Decoder circuit 270 applies a data decoding algorithm to decoder input 252 to yield a decoded output 271. Where decoded output 271 fails to converge (i.e., decoded output 271 includes errors), another iteration of the data decoding algorithm is applied to decoder input 252 guided by decoded output 271. This process is repeated until either decoded output 271 converges (i.e., is error free) or a timeout condition is met. Such a timeout condition may be, for example, a maximum number of iterations through decoder circuit 270. Alternatively, where decoded output 271 converges, it is provided as a decoded output 272 to a hard decision buffer circuit 290. Hard decision buffer circuit 290 provides the hard decisions of decoded output 272 as a hard decision output 292. At this juncture, iteration count 296 indicates the total number of iterations through decoder circuit 270 that were used to correct errors in soft data 225.

Figure 7:
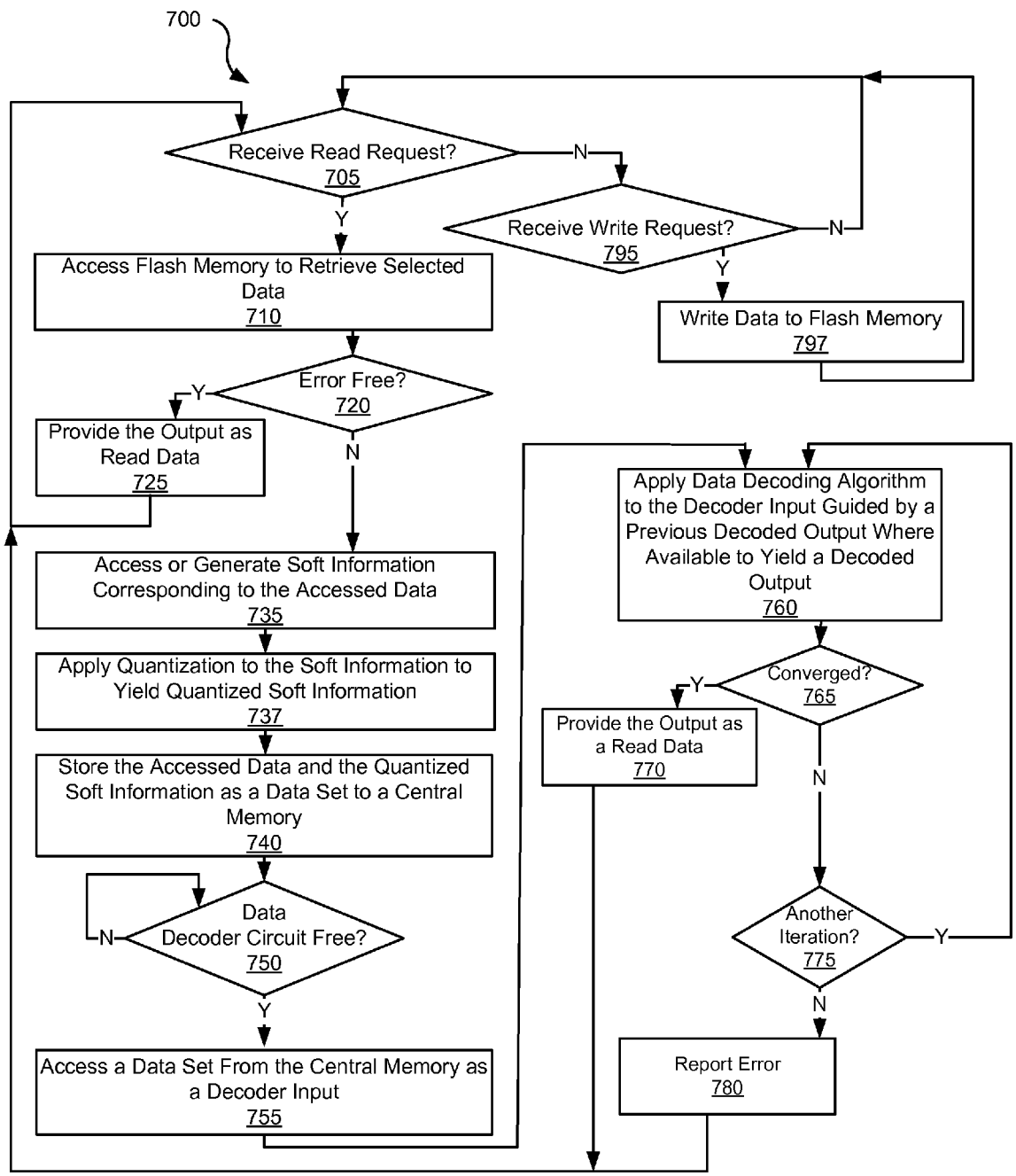
FIG. 7 is a flow diagram showing a method for using a solid state memory device including non-uniform transfer function based soft information modification in accordance with some embodiments of the present invention.

Turning to FIG. 7, a flow diagram 700 shows a method for using a solid state memory device including non-uniform transfer function based soft information modification in accordance with some embodiments of the present invention. Following flow diagram 700, it is determined whether a read request is received (block 705). Where a read request is not received (block 705), it is determined whether a write request has been received (block 795). Where a write request is received (block 795), data received is formatted and written to a location in the flash memory indicated by an address received as part of the write request (block 797), and the process returns to block 705.

Alternatively, when a read access is received (block 705), it includes an address indicating a location from which the data is to be accessed. Data is then accessed from the flash memory at the location indicated by the read request (block 710). It is determined whether the retrieved data is error free (block 720). Where it is determined that the data is error free (block 720), the retrieved data is provided as read data (block 725). The process then returns to block 705.

Otherwise, where it is not determined that the data is error free (block 720), soft information corresponding to the accessed data is either accessed or generated (block 735). Such soft information indicates a probability that given elements of the accessed data are correct. In some cases, this soft information is provided by a solid state memory device from which the data was accessed. In other cases, the soft information is generated. Such generation of soft information may be done using any approach known in the art for generating soft data. As one example, generation of soft information may be done similar to that disclosed in U.S. patent application Ser. No. 14/047,423 entitled "Systems and Methods for Enhanced Data Recovery in a Solid State Memory System", and filed by Xia et al. on Oct. 7, 2013. The entirety of the aforementioned application was previously incorporated herein by reference for all purposes.

Quantization is applied to the soft information to yield quantized soft information (block 737). The quantization includes applying a non-uniform transfer function to the soft information to yield the quantized soft information. As an example, each element of the soft information may be processed by the following non-uniform transfer function:

$$\text{Interim Value}_i = \text{sign}(\text{soft information}_i) * \text{scalar} * \text{abs}(\text{soft information}_i)^n,$$

where soft information$_i$ is the i$^{th}$ element of the soft information, n is a power value, and scalar is a scaling value. In a particular example where the soft information is five bit data and quantized soft information is four bit data, the value of the scalar may be 0.15, and the value of n may be (1.4). Each of Interim Value$_i$ are then rounded to the nearest integer value to yield a Rounded Value$_i$. Any instance of the Rounded Value$_i$ that is outside of the allowed range (e.g., −8 to +7) is saturated at the closest maximum. The quantized soft information and the data set is stored to a central memory circuit (block 740).

It is then determined whether the data decoder circuit is available for processing (block 750). Where the data decoder circuit is available for processing (block 750), a previously stored data set is accessed from the central memory as a decoder input (block 755). A data decoding algorithm is applied to the accessed data set to yield a decoded output (block 760). Where available (i.e., for the second and later iterations), a previous decoded output is used to guide application of the data decoding algorithm. In some embodiments of the present invention, the data decoding algorithm is a low density parity check decoding algorithm as are known in the art. Based upon the disclosure provided herein, one of ordinary skill in the art will recognize a variety of data decoding algorithms that may be used in relation to different embodiments of the present invention.

It is determined whether the decoded output converged (block 765). Where it is determined that the decoded output converged (block 765), the decoded output is provided as read data (block 770). The process then returns to block 705. Alternatively, where it is determined that the decoded output failed to converge (block 765). It is determined whether another iteration of the data decoding algorithm is allowed (block 775). In some cases, a maximum number of iterations of the data decoding algorithm is fixed or programmable. This is effectively a timeout condition. In some cases, the maximum number of allowable iterations of the data decoding algorithm is one hundred. Based upon the disclosure provided herein, one of ordinary skill in the art will recognize other numbers of iterations that may be allowed in relation to different embodiments of the present invention. Where another local iteration is not allowed (block 775), an error is indicated (block 780). The process then returns to block 705. Otherwise, where another iteration of the decoding algorithm is allowed (block 775), the processes of blocks 360-375 are repeated.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the system comprising:
   a soft data modification circuit operable to apply a transfer function to an original soft data corresponding to the data set accessed from a solid state memory device to yield a modified soft data set; and
   a data decoder circuit operable to apply one or more iterations of a data decoding algorithm to the data set accessed from the solid state memory device to yield a decoded output based at least in part on the modified soft data.

2. The data processing system of claim 1, wherein the data decoding algorithm is a low density parity check decoding algorithm.

3. The data processing system of claim 1, wherein the transfer function is a non-uniform transfer function.

4. The data processing system of claim 3, wherein the non-uniform transfer function is operable to decrease a probability indicated by a first portion of the original soft data, and to increase a probability indicating by a second portion of the original soft data.

5. The data processing system of claim 4, wherein the first portion of the original soft data exhibits a lower probability than the second portion of the original soft data.

6. The data processing system of claim 1, wherein the original soft data includes a first number of bits per element, wherein the modified soft data set includes a second number of bits per element, wherein the transfer function is a non-uniform transfer function that is applied to yield an interim data set, and wherein the soft data modification circuit is further operable to force the value of any element of the interim data set that falls outside of a range of the second number of bits per element to equal the nearest extreme of the range to yield the modified soft data set.

7. The data processing system of claim 1, wherein the data processing system is implemented in an integrated circuit.

8. The data processing system of claim 1, wherein the data processing system further comprises:
   the solid state memory device operable to maintain the data set; and
   wherein the data processing system including the solid state memory device is implemented on an integrated circuit.

9. The data processing system of claim 8, wherein the solid state memory device is a flash memory device.

10. The data processing system of claim 9, wherein the flash memory device is able to hold multiple bits of data in each memory cell of the flash memory device.

11. The data processing system of claim 1, wherein the system further comprises:
    a soft data generation circuit operable to generate the original soft data.

12. A method for recovering data from a memory, the method comprising:
    receiving a data set from a memory device;
    applying a transfer function to an original soft data corresponding to the data set accessed from a memory device to yield a modified soft data set; and
    applying at least one iteration of a data decoding algorithm to the modified soft data set using a data decoding circuit to yield a decoded output.

13. The method of claim 12, wherein the data decoding algorithm is a low density parity check decoding algorithm.

14. The method of claim 12, wherein the transfer function is a non-uniform transfer function.

15. The method of claim 14, wherein the non-uniform transfer function is operable to decrease a probability indicated by a first portion of the original soft data, and to increase a probability indicating by a second portion of the original soft data.

16. The method of claim 15, wherein the first portion of the original soft data exhibits a lower probability than the second portion of the original soft data.

17. The method of claim 12, wherein the original soft data includes a first number of bits per element, wherein the modified soft data set includes a second number of bits per element, wherein the transfer function is a non-uniform transfer function that is applied to yield an interim data set, and wherein applying the non-uniform transfer function to the original soft data yield a modified soft data set includes:
    applying the applying the non-uniform transfer function to the original soft data yields an interim data set; and
    forcing any element of the interim data set that falls outside of a range of the second number of bits per element to equal the nearest extreme of the range to yield the modified soft data set.

18. The method of claim 12, wherein the memory device is a flash memory device.

19. The method of claim 18, wherein the flash memory device is able to hold multiple bits of data in each memory cell of the flash memory device.

20. A memory system comprising:
    a solid state memory device operable to maintain a data set;
    a soft data generation circuit operable to generate original soft data corresponding to the data set;

a soft data modification circuit operable to apply a transfer function to an original soft data corresponding to the data set accessed from a memory device to yield a modified soft data set; and a data decoder circuit operable to apply one or more iterations of a data decoding algorithm to the data set accessed from the memory device to yield a decoded output based at least in part on the modified soft data.

* * * * *